(12) United States Patent
Park et al.

(10) Patent No.: US 10,085,339 B2
(45) Date of Patent: Sep. 25, 2018

(54) METHOD OF MANUFACTURING ELECTROCONDUCTIVE NANOWIRE NETWORK USING ELECTRON BEAM, TRANSPARENT ELECTRODE AND ELECTRONIC DEVICE USING THE SAME

(71) Applicant: UNIST(ULSAN NATIONAL INSTITUTE OF SCIENCE AND TECHNOLOGY), Ulsan (KR)

(72) Inventors: Hyung Wook Park, Ulsan (KR); Ji Soo Kim, Ulsan (KR); Myoung Hoon Song, Ulsan (KR); Yun Seok Nam, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/346,729

(22) Filed: Nov. 9, 2016

(65) Prior Publication Data

US 2017/0164467 A1   Jun. 8, 2017

(30) Foreign Application Priority Data

Dec. 7, 2015 (KR) .......................... 10-2015-0173336

(51) Int. Cl.
*B05D 5/12* (2006.01)
*H05K 1/02* (2006.01)
(Continued)

(52) U.S. Cl.
CPC ............. *H05K 1/0274* (2013.01); *H05K 1/09* (2013.01); *H05K 3/22* (2013.01); *B82Y 20/00* (2013.01);
(Continued)

(58) Field of Classification Search
CPC .......... H05K 1/0274; H05K 1/09; H05K 3/22; H05K 2201/0108; H05K 2203/092;
(Continued)

(56) References Cited

U.S. PATENT DOCUMENTS 6,049,162 A   4/2000 Schultheiss et al.
2014/0332254 A1* 11/2014 Pellerite .............. G02F 1/13439
174/251

(Continued)

FOREIGN PATENT DOCUMENTS

JP          3202244 B2    8/2001
KR  10-2012-0092294 A    8/2012
(Continued)

OTHER PUBLICATIONS

Shultz ("Electron Beam Welding" (Jan. 1994)).*
Kautz et al. "A Characterization of Pulsed Electron Beam Welding Parameters" (1991).*

*Primary Examiner* — Austin Murata
(74) *Attorney, Agent, or Firm* — Revolution IP, PLLC

(57) ABSTRACT

Disclosed is a method of manufacturing an electroconductive nanowire network using an electron beam, the method comprising: forming a nanowire network using electroconductive nanowires; and welding junctions of the electroconductive nanowires by irradiating an electron beam on the nanowire network, wherein the electroconductive nanowires comprise silver (Ag) nanowires and the forming of the nanowire network comprises forming the nanowire network by spin-coating a suspension in which isopropyl alcohol (IPA) and the Ag nanowires are mixed.

5 Claims, 11 Drawing Sheets

(51) Int. Cl.
*H05K 1/09* (2006.01)
*H05K 3/22* (2006.01)
*B82Y 40/00* (2011.01)
*B82Y 20/00* (2011.01)

(52) U.S. Cl.
CPC ...... *B82Y 40/00* (2013.01); *H05K 2201/0108* (2013.01); *H05K 2203/092* (2013.01); *Y10S 977/762* (2013.01); *Y10S 977/81* (2013.01); *Y10S 977/95* (2013.01); *Y10S 977/953* (2013.01); *Y10S 977/954* (2013.01)

(58) Field of Classification Search
CPC ..... B82Y 20/00; B82Y 40/00; Y10S 997/762; Y10S 997/81; Y10S 997/95; Y10S 997/953; Y10S 997/954
See application file for complete search history.

(56) References Cited

U.S. PATENT DOCUMENTS

| | | | | |
|---|---|---|---|---|
| 2016/0038909 A1* | 2/2016 | Choy | ................. | B01J 19/127 |
| | | | | 174/126.1 |
| 2016/0111729 A1* | 4/2016 | Kim | ................. | H01M 4/64 |
| | | | | 429/235 |
| 2016/0148781 A1* | 5/2016 | Tsuno | ................. | H01J 37/244 |
| | | | | 250/307 |

FOREIGN PATENT DOCUMENTS

| | | |
|---|---|---|
| KR | 10-2014-0040919 A | 4/2014 |
| KR | 10-1440396 B1 | 9/2014 |
| WO | 2014/129504 A1 | 8/2014 |

\* cited by examiner (a)

| PLEDs with electrode | $L_{max}$ [cd/m²] @ bias | $LE_{max}$ [cd/A] @ bias | $PE_{max}$ [lm/W] @ bias | $EQE_{max}$ [%] @ bias | turn-on voltage [V] @ 0.1 cd/m² |
|---|---|---|---|---|---|
| ITO | 58,100 (11.0V) | 9.86 (4.5V) | 9.43 (3.0V) | 3.36 (4.5V) | 3.36 (4.5V) |
| LPEB welded AgNWs | 25,600 (10.0 V) | 7.37 (5.0 V) | 6.01 (3.0V) | 2.46 (5.0V) | 2.46 (5.0V) |

METHOD OF MANUFACTURING ELECTROCONDUCTIVE NANOWIRE NETWORK USING ELECTRON BEAM, TRANSPARENT ELECTRODE AND ELECTRONIC DEVICE USING THE SAME

CROSS-REFERENCE TO RELATED PATENT APPLICATION

This application claims the benefit of Korean Patent Application No. 10-2015-0173336, filed on Dec. 7, 2015, in the Korean Intellectual Property Office, the disclosure of which is incorporated herein in its entirety by reference.

BACKGROUND OF THE INVENTION

1. Field of the Invention

The present invention relates to a method of manufacturing an electroconductive nanowire network using an electron beam, a transparent electrode and an electronic device using the same, and more particularly, to a method of manufacturing an electroconductive nanowire network using an electron beam capable of forming a network of nanowires by irradiating an electron beam, a transparent electrode and an electronic device using the same.

2. Description of the Related Art

In general, a transparent electrode is used in a semiconductor device, such as a touch screen, an illumination device, a solar cell, and a sensor. An indium tin oxide (ITO) is usually used as the transparent electrode. However, because indium is a rare metal and supply and demand of indium is unstable, a unit cost of the ITO is very high.

In these days, research into a transparent electrode material that replaces the ITO has been briskly carried out. Metal-based nanowires etc. are suggested as the transparent electrode material that replaces the ITO, and in particular, silver (Ag) nanowires can be used in various fields, such as touch panels, because the Ag nanowires have high electroconductivity and high light transmittance.

A method of forming a network of nanowires includes a method of forming a network of nanowires by spin or spray coating nanowires with a dispersion solution and a method of forming a network of nanowires by performing high-temperature thermal annealing or plasma welding.

In the spin or spray coating method, a structure of the network of the nanowires is weak and thus, stability thereof is lowered.

Meanwhile, in the high-temperature thermal annealing method, because surfaces of metal nanowires are overall uniformly thermal-annealed, unnecessary portions other than junctions of the metal nanowires are also thermal-annealed such that electroconductivity of an Ag nanowire network is rather lowered.

In the plasma welding method, a coupling portion can be selectively welded but, a sheet resistance of the nanowires is very large.

SUMMARY OF THE INVENTION

The present invention provides a method of manufacturing an electroconductive nanowire network using an electron beam capable of thermal-annealing only junctions of nanowires, a transparent electrode and an electronic device using the same.

According to an aspect of the present invention, there is provided a method of manufacturing an electroconductive nanowire network using an electron beam, the method including: forming a nanowire network using electroconductive nanowires; and welding junctions of the electroconductive nanowires by irradiating an electron beam on the nanowire network.

According to another aspect of the present invention, there is provided a transparent electrode in which electroconductive nanowires form a nanowire network on a base material and junctions of the electroconductive nanowires are welded by irradiating an electron beam on the nanowire network.

According to another aspect of the present invention, there is provided an electronic device including a transparent electrode in which electroconductive nanowires form a nanowire network on a base material and junctions of the electroconductive nanowires are welded by irradiating an electron beam on the nanowire network.

BRIEF DESCRIPTION OF THE DRAWINGS

The above and other features and advantages of the present invention will become more apparent by describing in detail exemplary embodiments thereof with reference to the attached drawings in which:

FIG. 9 is a table showing a device performance of the FPLED illustrated in FIG. 8;

DETAILED DESCRIPTION OF THE INVENTION

Hereinafter, exemplary embodiments of the present invention will now be described with reference to the accompanying drawings.

In an electronic device including a transparent electrode according to an embodiment of the present invention, an electroconductive nanowire network is formed on a PET film, and junctions of electroconductive nanowires that constitute the electroconductive nanowire network are welded by irradiating an electron beam.

The electronic device includes a touch panel, a light-emitting diode (LED), a solar cell, and various sensors.

The PET film is a polyethylene terephthalate (PET) film, is transparent and has flexibility.

An example in which silver (Ag) nanowires are used as the electroconductive nanowires, will be described, but other electroconductive materials may also be used as the electroconductive nanowires.

A method of manufacturing an electroconductive nanowire network of a transparent electrode having the above configuration will be described below.

Figure 1:
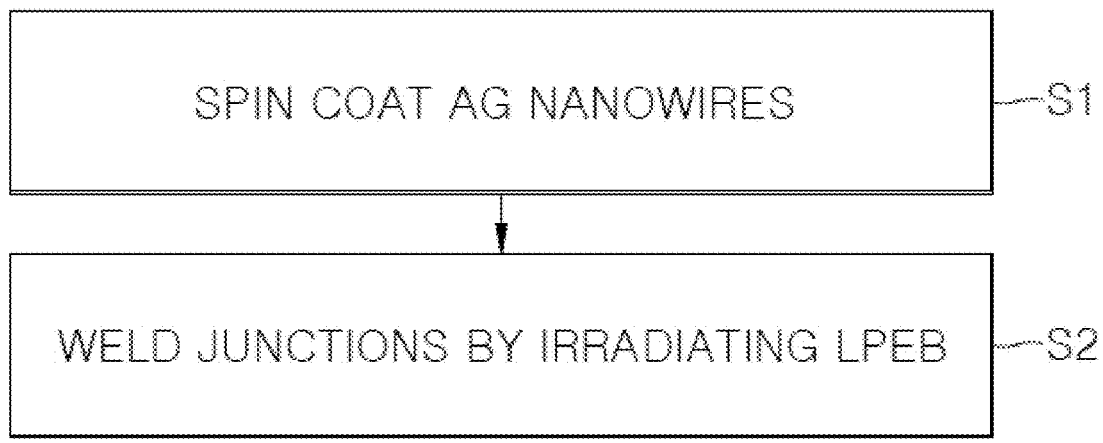
FIG. 1 is a flowchart illustrating a method of manufacturing an electroconductive nanowire network using an electron beam according to an embodiment of the present invention.
Figure 2:
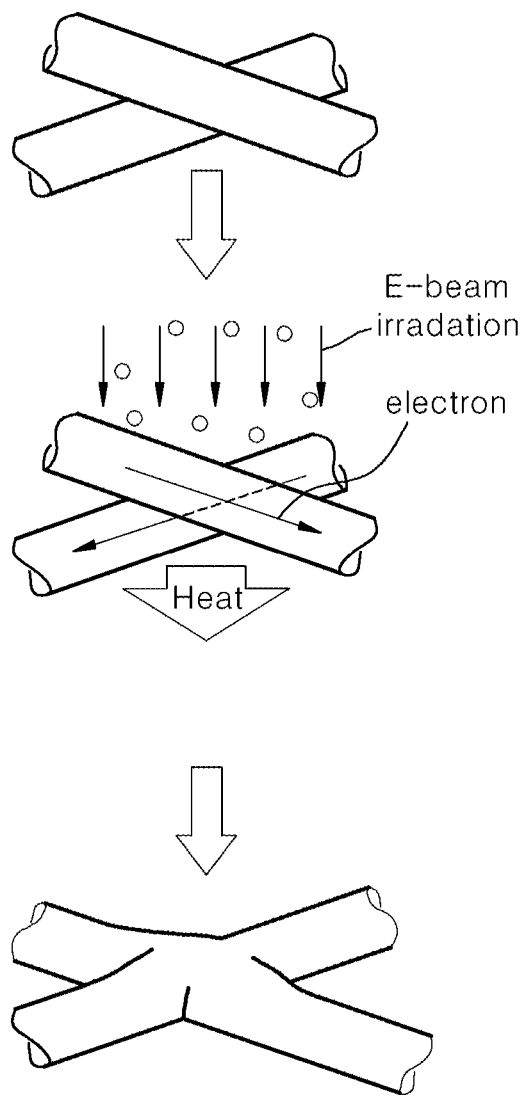
FIG. 2 is a view illustrating the method of manufacturing an electroconductive nanowire network using an electron beam illustrated in FIG. 1.

FIG. 1 is a flowchart illustrating a method of manufacturing an electroconductive nanowire network using an electron beam according to an embodiment of the present invention. FIG. 2 is a view illustrating the method of manufacturing an electroconductive nanowire network using an electron beam illustrated in FIG. 1.

Referring to FIGS. 1 and 2, firstly, electroconductive nanowires are spin-coated to form a nanowire network (S1).

An example in which the electroconductive nanowires are silver (Ag) nanowires, will be described, but embodiments of the present invention are not limited thereto, and any electroconductive material may be used for the electronconductive nanowires.

An isopropyl alcohol (IPA)-based Ag nanowire suspension is used when the spin coating is performed. The Ag nanowires included in the IPA-based Ag nanowire suspension have a length of about 20 to 30 μm and a diameter of about 30 to 40 nm. About 0.5 wt % of isopropyl alcohol is included in the IPA-based Ag nanowire suspension.

The Ag nanowire network is formed on the PET film.

As described above, when the electroconductive nanowires are spin-coated to form the nanowire network, junctions of the Ag nanowires are not welded. That is, the junctions of the Ag nanowires are only in a physical contact state.

Subsequently, an electron beam is irradiated on the nanowire network so that only the junctions of the Ag nanowires are welded (S2).

A large pulsed electron beam (LPEB) is used as the electron beam.

A wavelength of a pulse of the electron beam is in the range of 0.1 to 0.2 Hz. The electron beam has an acceleration voltage of about 5 kV and is irradiated as a single pulse. The pulse wavelength of the electron beam is determined by adjusting an irradiation time interval between pulses to be 5 to 10 seconds.

The number of irradiation of the electron beam is 1 to 3 times.

When the acceleration voltage of the electron beam exceeds 5 kV or the number of irradiation of the electron beam exceeds 1 to 3 times, the junctions of the nanowire network are not welded but are evaporated. Because, due to excessive energy delivery, metallic bubbles are generated, electroconductivity of the nanowire network is lost, and a sheet resistance of the nanowires is greatly increased such that the function of the electroconductive network is lost.

Figure 3:
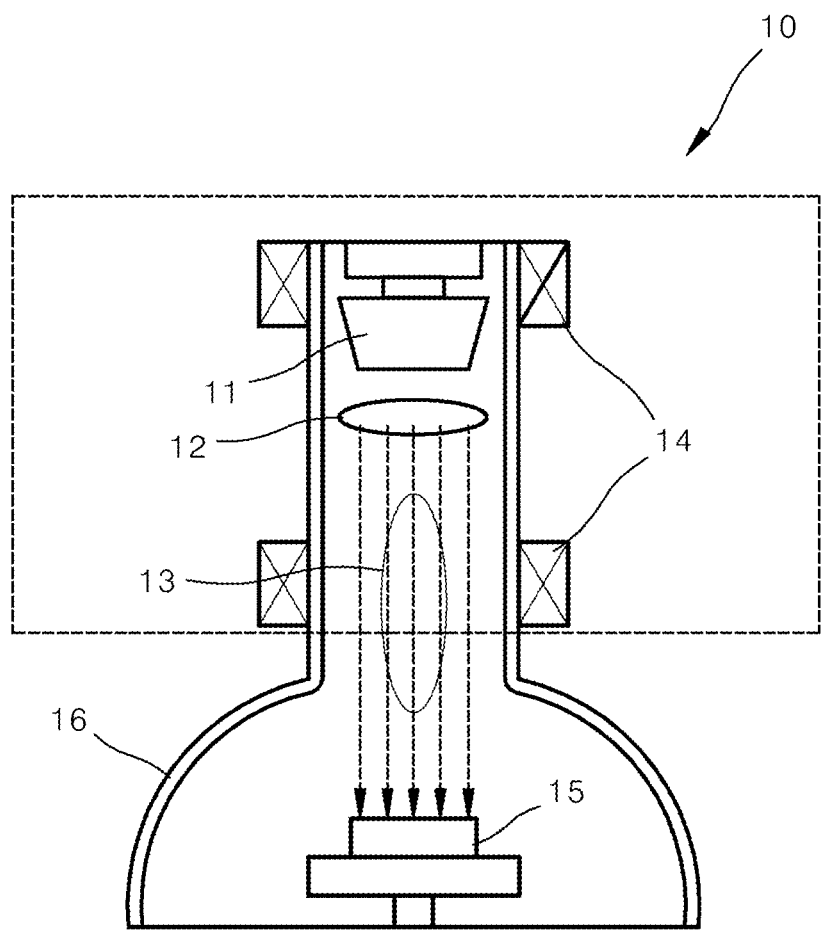
FIG. 3 is a view schematically illustrating a large pulsed electron beam (LPEB) irradiation device used in the method illustrated in FIG. 1.

FIG. 3 is a view schematically illustrating a large pulsed electron beam (LPEB) irradiation device used in the method illustrated in FIG. 1.

Referring to FIG. 3, the LPEB 10 includes a cathode 11, a solenoid 14, and a vacuum tube 16. Reference numeral 12 denotes cathode plasma, reference numeral 13 denotes anode plasma, and reference numeral 15 denotes a workpiece having spin-coated Ag nanowires.

Irradiation of the electron beam is performed in the vacuum tube 16 filled with an argon (Ar) gas. Electrons between the cathode 11 and an anode are accelerated and deliver energy to the workpiece 15 via plasma. Because the electron beam having the diameter of 50 to 80 mm is irradiated, in the current embodiment, the diameter of the electron beam is fixed to be about 60 mm. The electron beam has an acceleration voltage of about 5 kV and is irradiated as a single pulse. When the acceleration voltage of the electron beam exceeds 5 kV, surface texture is deteriorated, and metallic bubbles are generated at ends of the Ag nanowires.

When the electron beam is irradiated on the nanowire network, the junctions of the Ag nanowires are welded.

Referring to FIG. 2, when the electron beam is irradiated on the nanowire network, the accelerated electrons flow along the Ag nanowires. In this case, a resistance increases at the junctions of the Ag nanowires, and heat is generated at the junctions. Thus, due to heat generated at the junctions, junction is performed at the junctions.

That is, when the LPEB is irradiated on the nanowire network, heat is generated only at the junctions, and junction is performed only at the junctions. Thus, other portions than the junctions can be prevented from being thermal-annealed. Thus, electroconductivity of the nanowire network can be prevented from being deteriorated when other portions than the junctions are thermal-annealed.

In addition, when the electron beam is irradiated, a fast temperature change occurs in a substrate so that only the junctions can be more quickly molten and re-coagulated. When the electron beam is irradiated, a cooling rate is about $10^7$ K/s or more. Due to the best cooling rate, a metal may have a crystalline structure, and this change may change mechanical characteristics including hardness or elastic modulus. Meanwhile, in a conventional high-temperature thermal annealing method, heat transfer needs to be continuously maintained during the molten and re-coagulated procedure so that a very long time is required.

Figure 4:
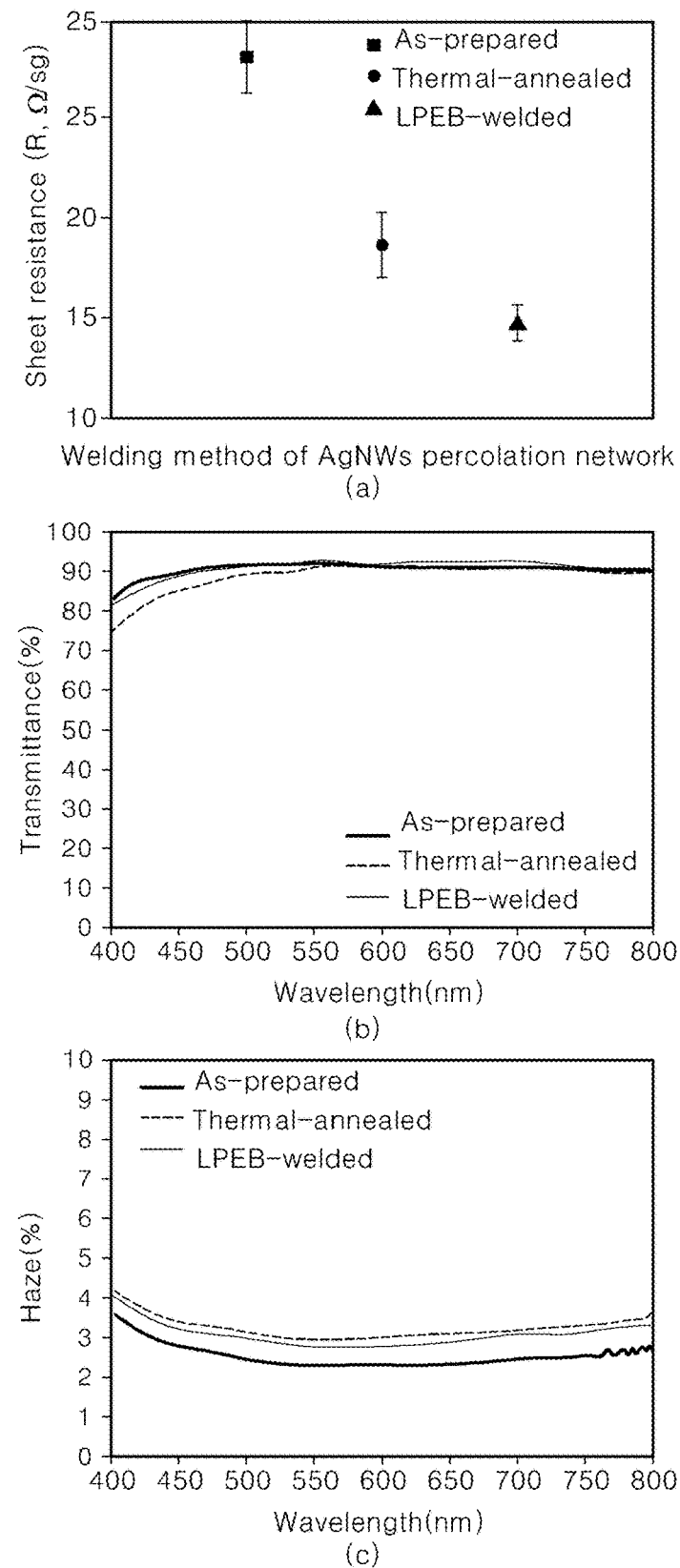
FIG. 4 illustrates graphs (a), (b) and (c) of comparison of characteristics of a welded silver (Ag) nanowire network according to the method of manufacturing an electroconductive nanowire network using an electron beam illustrated in FIG. 1 with characteristics of a welded Ag nanowire network according to a conventional manufacturing method.

FIGS. 4A through 4C are graphs of comparison of characteristics of a welded Ag nanowire network according to the method of manufacturing an electroconductive nanowire network using an electron beam illustrated in FIG. 1 with characteristics of a welded Ag nanowire network according to a conventional manufacturing method.

FIG. 4A illustrates a sheet resistance of nanowires according to a method of welding an Ag nanowire network.

Referring to FIG. 4A, a sheet resistance of as-prepared Ag nanowires before thermal annealing or irradiation of an electron beam is performed, is highest, because of contact resistances therebetween.

Thermal annealing is a conventional junction method of heating the entire region. Because a contact resistance of junction portions is reduced after high-temperature thermal annealing is performed, the sheet resistance of the Ag nanowires is reduced. The sheet resistance of the Ag nanowires after high-temperature thermal annealing is performed, is about 18.57 Ω/sq.

Meanwhile, the sheet resistance of the Ag nanowires after irradiation of the LPEB is performed, is about 12.53 Ω/sq. Thus, the sheet resistance of the Ag nanowires after irradiation of the LPEB is performed, is lowest.

FIGS. 4B and 4C show transmittance and haze according to a method of welding an Ag nanowire network.

Referring to FIGS. 4B and 4C, transmittance and haze are maintained even after irradiation of the LPEB is performed.

Figure 5:
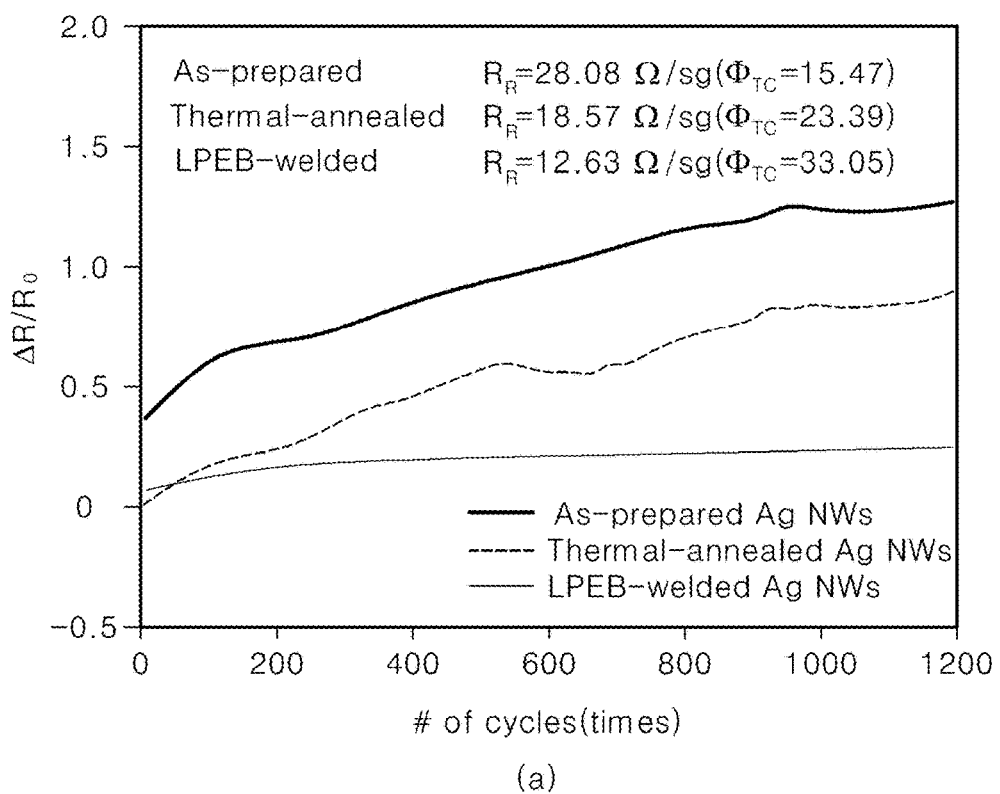
FIG. 5 illustrates graphs (a) and (b) of the result of a cyclic bending test according to the method of manufacturing an electroconductive nanowire network using an electron beam illustrated in FIG. 1 and the result of a cyclic bending test according to the conventional manufacturing method, respectively.
Figure 5:
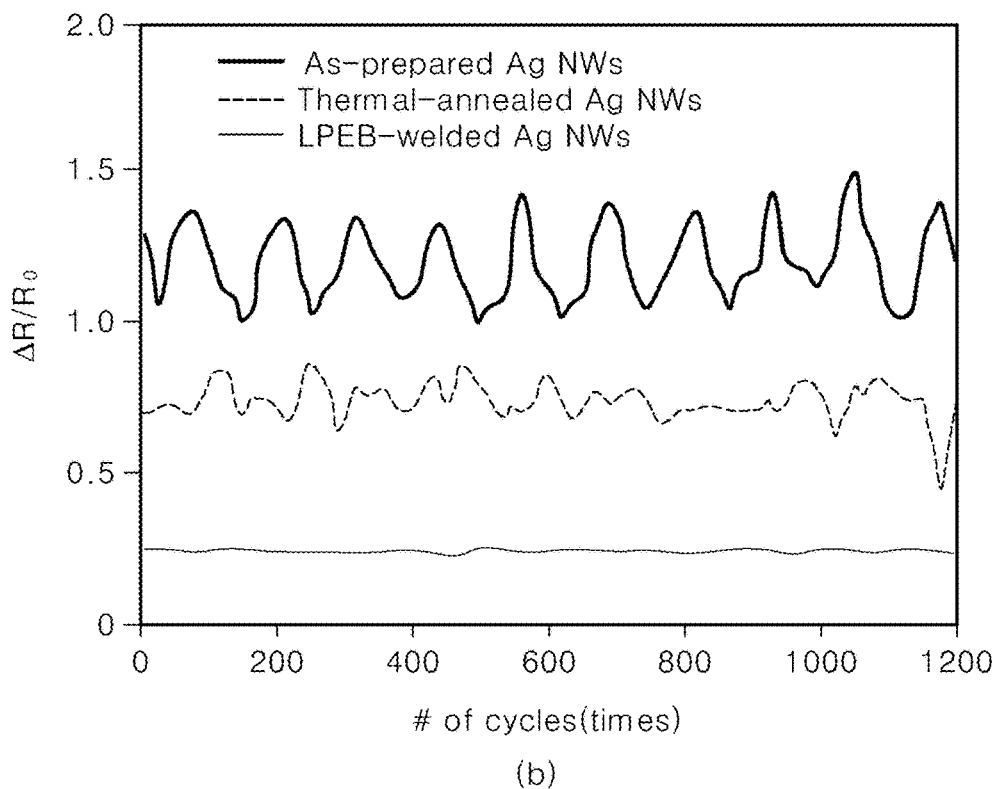

FIGS. 5A and 5B are graphs of the result of a cyclic bending test according to the method of manufacturing an electroconductive nanowire network using an electron beam illustrated in FIG. 1 and the result of a cyclic bending test according to the conventional manufacturing method, respectively. FIG. 5A is a graph showing a relative change in sheet resistance according to repetitive cyclic bending indicated by a trend line, and FIG. 5B is a graph showing a relative change in sheet resistance according to cyclic bending.

Referring to FIGS. 5A and 5B, there's been a 35% increase in sheet resistance of as-prepared Ag nanowires before thermal annealing or irradiation of an electron beam is performed, over an initial value as soon as bending starts, there's been a continuous increase in sheet resistance according to a repetitive bending cycle, and the sheet resistance is about 2.3 times the initial value after a $1000^{th}$ cycle.

A sheet resistance of the thermal-annealed Ag nanowires is continuously increased as a bending cycle is repeated, and there's been an increase of about 1.9 times the initial value after the $1000^{th}$ cycle.

A sheet resistance of an Ag nanowire network on which irradiation of an LPEB is performed, is maintained at a similar level to an initial value, and there's been only an increase of about 30% in sheet resistance after a $1200^{th}$ bending cycle. Thus, because there's been a smallest change in sheet resistance of the Ag nanowire network welded using irradiation of the LPEB even after a repetitive bending test is performed, an Ag nanowire electrode can be used as an electrode that is transparent and has flexibility.

Figure 6:
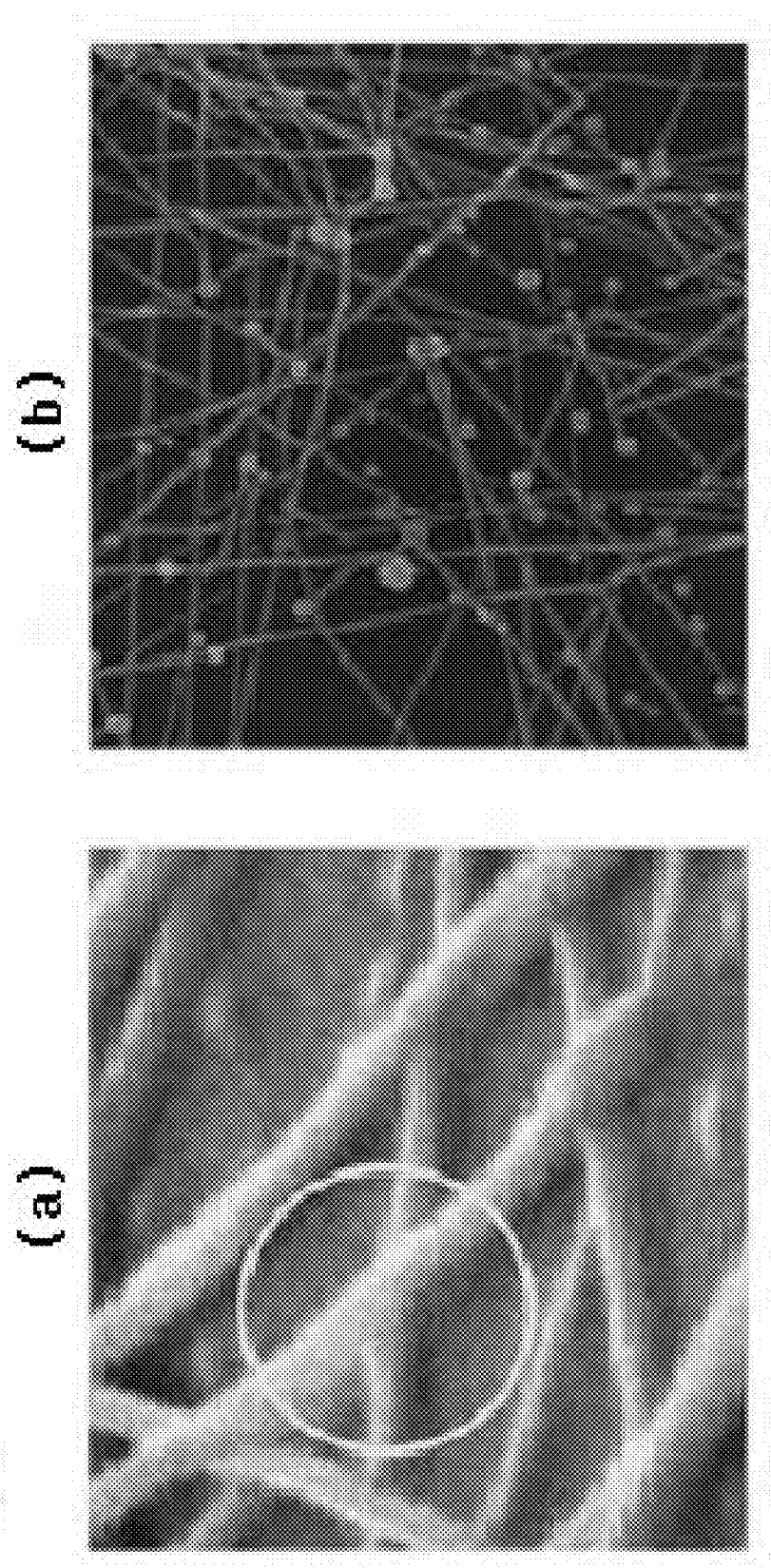
FIG. 6 is scanning electron microscope (SEM) photos showing an Ag nanowire network according to an embodiment of the present invention.

FIGS. 6A and 6B are scanning electron microscope (SEM) photos showing an Ag nanowire network according to an embodiment of the present invention.

FIG. 6A is an SEM photo showing a welded state of junctions when an acceleration voltage of the electron beam is 5 kV or less, and FIG. 6B is an SEM photo showing a state in which metallic bubbles are generated at ends of the Ag nanowires when the acceleration voltage of the electron beam exceeds 5 kV.

Figure 7:
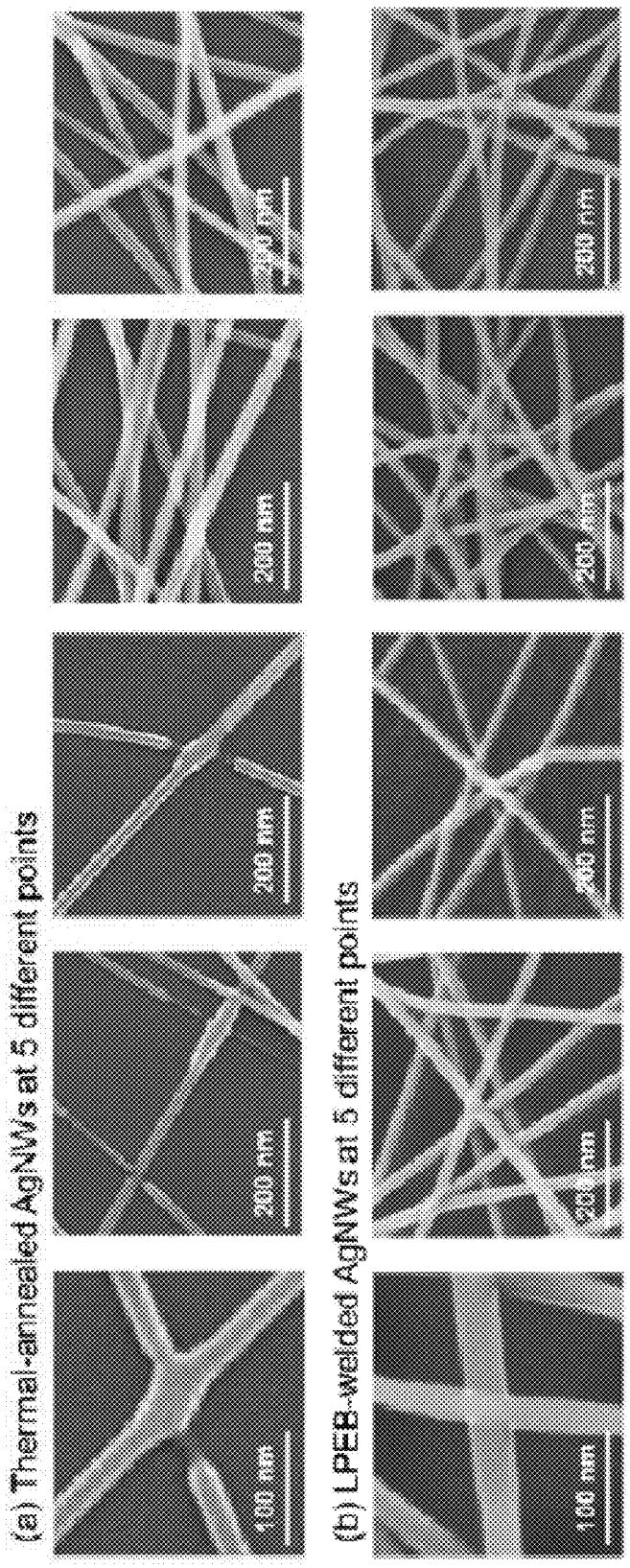
FIG. 7 is SEM photos comparing an Ag nanowire network according to the method of manufacturing an electroconductive nanowire network using an electron beam illustrated in FIG. 1 with an Ag nanowire network according to the conventional manufacturing method.

FIGS. 7A and 7B are SEM photos comparing an Ag nanowire network according to the method of manufacturing an electroconductive nanowire network using an electron beam illustrated in FIG. 1 with an Ag nanowire network according to the conventional manufacturing method.

FIG. 7A is an SEM photo showing an Ag nanowire network in which junctions of Ag nanowires are welded due to thermal annealing. Referring to FIG. 7A, because, when thermal annealing is performed, the entire region of the Ag nanowire network is thermal-annealed with the same amount of heat, an excessive amount of heat is unnecessarily supplied to portions where the Ag nanowires do not cross or a density of the Ag nanowires is relatively low, such that an evaporation phenomenon due to excessive heat occurs.

FIG. 7B is an SEM photo showing the Ag nanowire network in which junctions of the Ag nanowires are welded due to irradiation of the electron beam. Referring to FIG. 7B, when the electron beam is irradiated on the Ag nanowires, the Ag nanowires themselves function as a heat source, and an appropriate amount of energy for junction may be supplied to the Ag nanowires according to the density of the Ag nanowires. Thus, heat of a higher temperature than those of other regions is generated at junctions where the density of the Ag nanowires is high, such that junction of the Ag nanowires can be performed.

Figure 8:
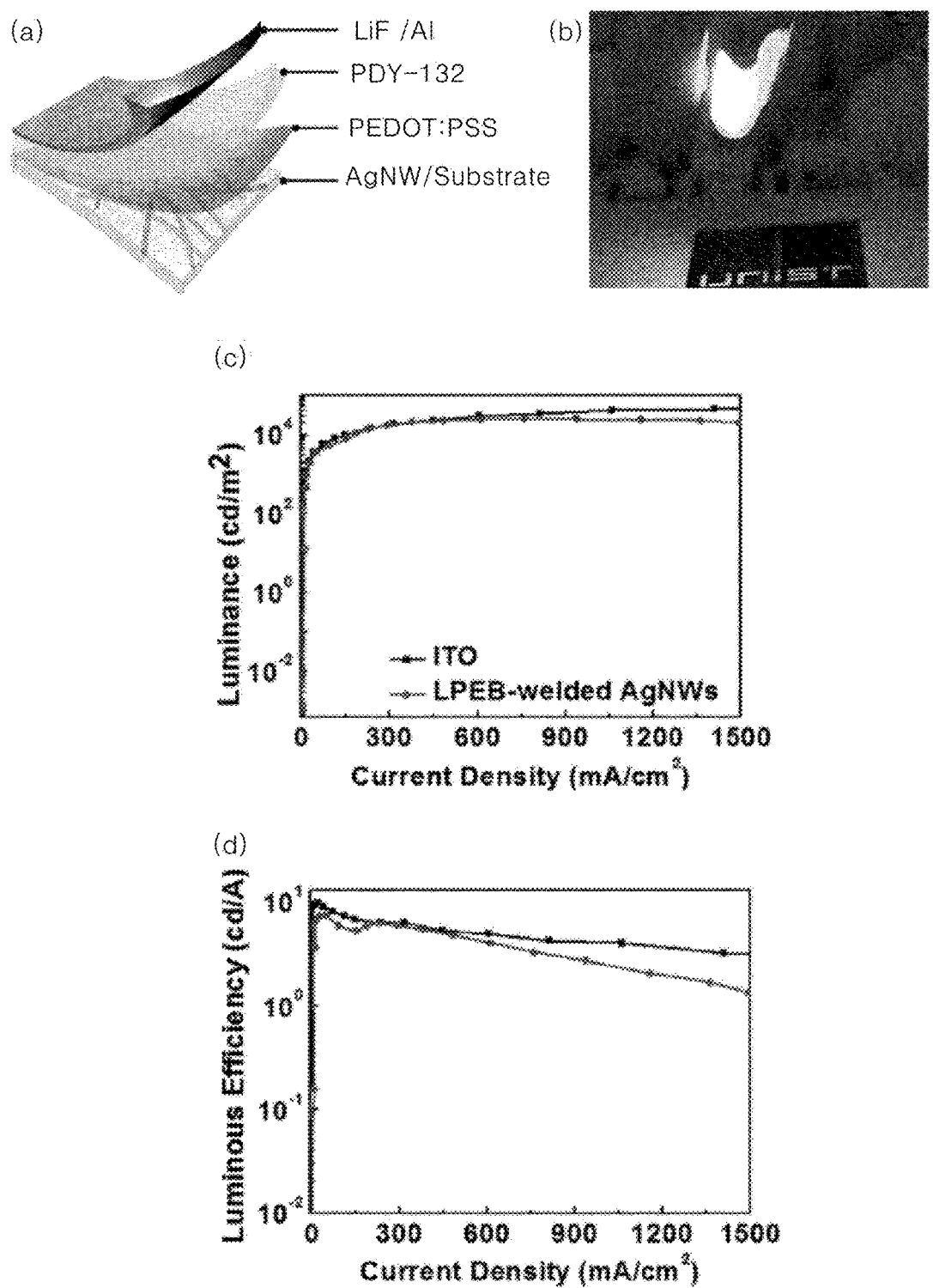
FIG. 8 illustrates characteristics of a flexible polymer light-emitting diode (FPLED) using an electroconductive nanowire network according to an embodiment of the present invention.

FIGS. 8A through 8D illustrate characteristics of a flexible polymer light-emitting diode (FPLED) using an electroconductive nanowire network according to an embodiment of the present invention, and FIG. 9 is a table showing a device performance of the FPLED illustrated in FIG. 8.

FIGS. 8A and 8B show a structure of the FPLED manufactured using an Ag nanowire electrode welded with the LPEB.

Referring to FIGS. 8C, 8D, and 9, luminance $L_{max}$ of the FPLED is maximum 25600 cd/m² at 10 V, and luminous efficiency $LE_{max}$ of the FPLED is 7.37 cd/A at 5 V and is a little lower than that of an indium tin oxide (ITO) electrode. This is because pores electrically exist between the nanowires.

Figure 10:
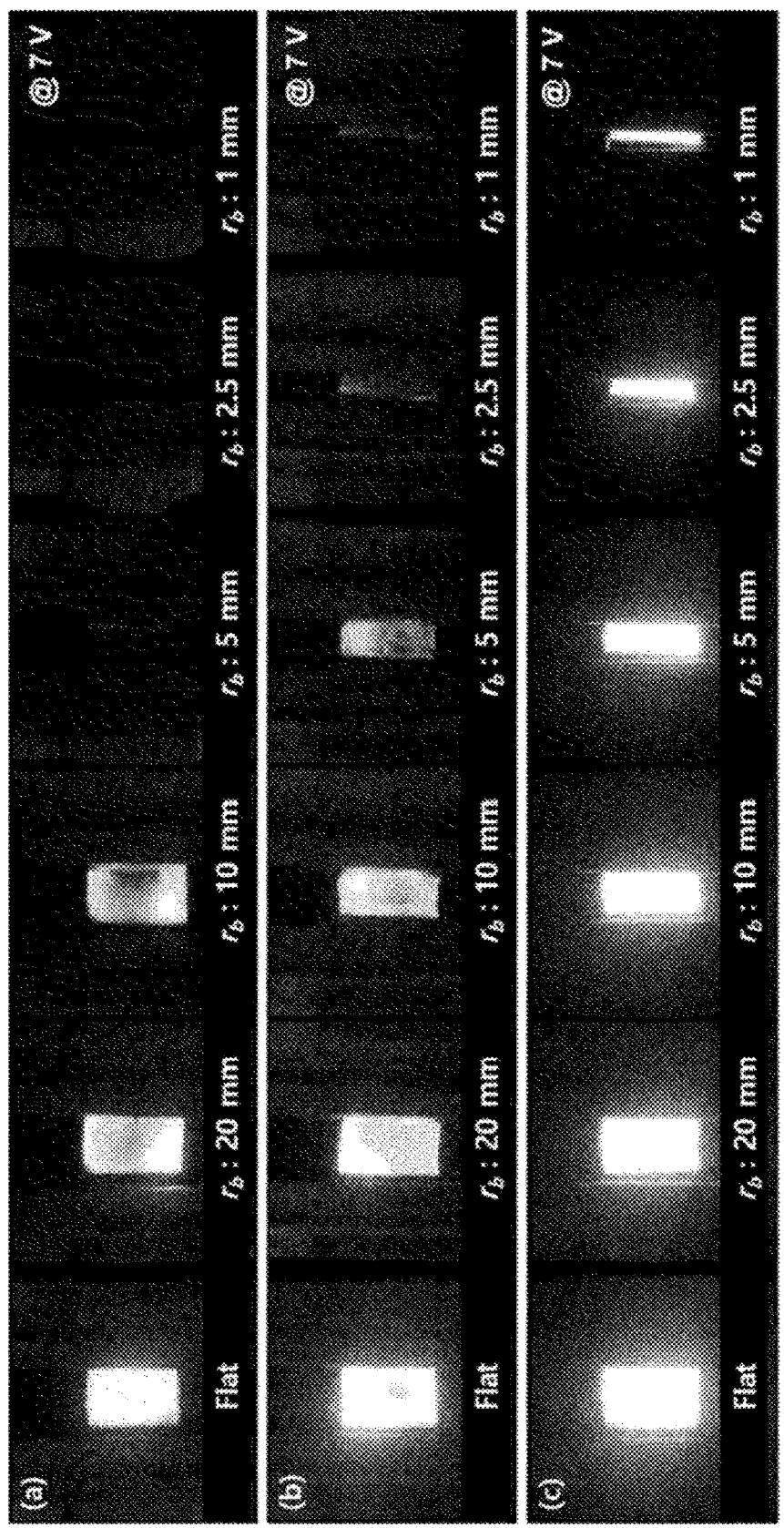
FIG. 10 is photos comparing the FPLED using an electroconductive nanowire network according to an embodiment of the present invention with different samples of FPLEDs.

FIGS. 10A through 10C are photos comparing the FPLED using the electroconductive nanowire network according to an embodiment of the present invention with different samples of FPLEDs.

FIG. 10A shows an FPLED (sample 1) manufactured without a junction process, FIG. 10B shows a thermal-annealed FPLED (sample 2), and FIG. 10C shows an FPLED (sample 3) using LPEB junction.

Referring to FIG. 10A, junction of the nanowires easily destroys at a bending stress where a curvature radius rb is 10 mm. Referring to FIG. 10B, in the thermal-annealed FPLED (sample 2), an electroluminescence (EL) strength is very weak at bending where the curvature radius rb is 5 mm or less. Referring to FIG. 10C, because the FPLED (sample 3) using LPEB junction is very flexible, stable EL emission is performed even in large deformation.

Figure 11:
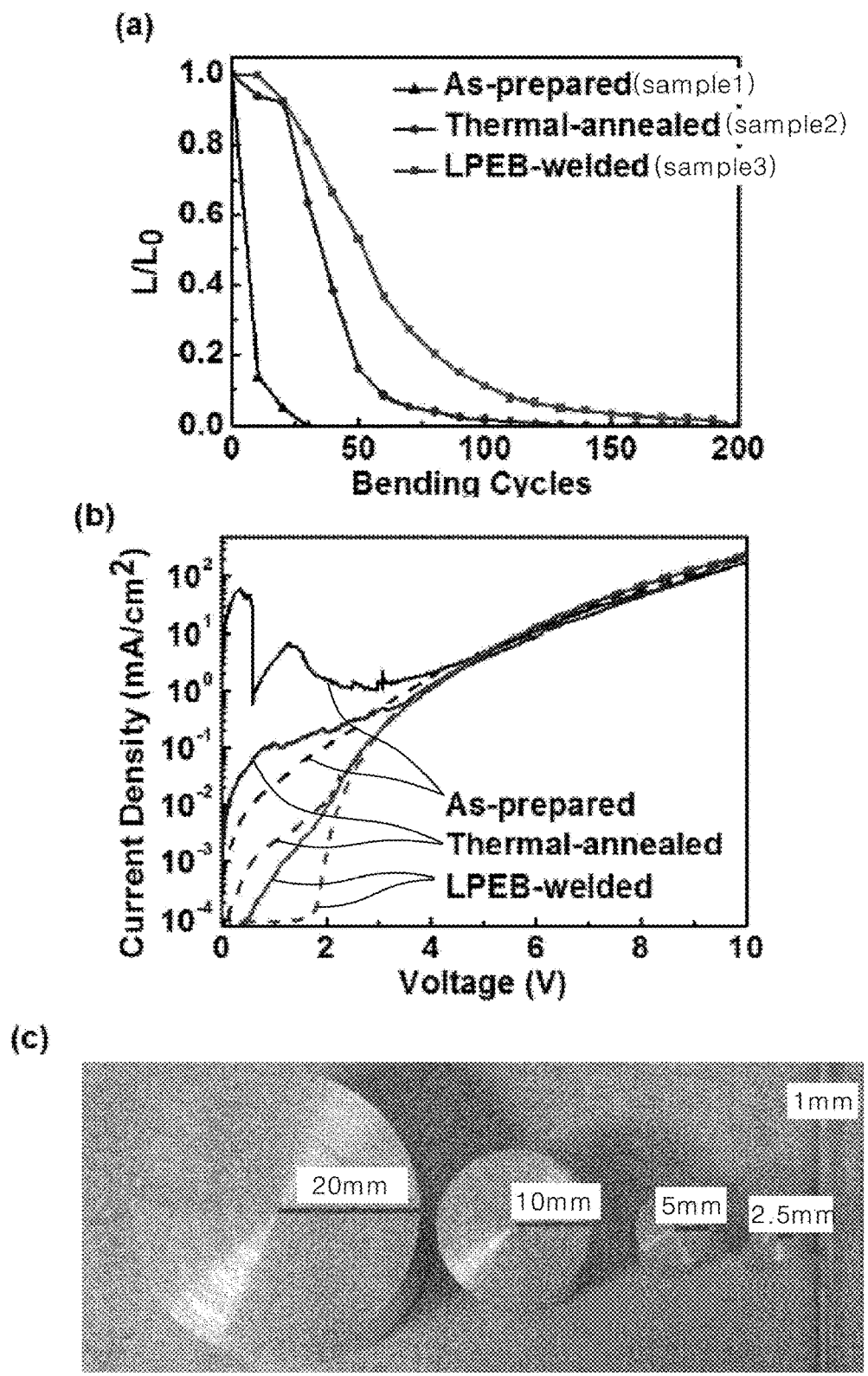
FIG. 11 illustrates a graph (a) of comparison of a change in luminance of the FPLED when rb is 2.5 mm, a graph (b) of J-V characteristics before bending is performed and after bending is performed, respectively, when rb is 0.5 mm; and a photo (c) of a cylindrical object for a bending test having a given rb.

FIG. 11A is a view of comparison of a change in luminance of the FPLED when rb is 2.5 mm, FIG. 11B illustrates J-V characteristics before bending is performed and after bending is performed, respectively, when rb is 0.5 mm, and FIG. 11C illustrates a cylindrical object for a bending test having a given rb.

In addition, referring to FIG. 11A, there's been a slow reduction in luminance change of the FPLED using LPEB junction over other samples.

Referring to FIG. 11B, in the FPLED (sample 1) manufactured without a welding process, irregular noise occurs in a low voltage region. Also, a high contact resistance of an unwelded junction portion causes a leakage current, and durability of the FPLED (sample 1) manufactured without the welding process is weak. In the FPLED (sample 2) on which thermal annealing is performed, a leakage current is reduced compared to that of sample 1 but is higher than that of sample 3. In the FPLED (sample 3) using LPEB junction, there's been hardly a leakage current. This means that a leakage current is reduced in a voltage region with a minimized junction defect.

As described above, according to the present invention, an electron beam is irradiated on an electroconductive nanowire network so that only junctions of nanowires can be welded using heat caused by a resistance generated at the junctions of the nanowires and thus other portions than the junctions can be prevented from being thermal-annealed and deterioration of electroconductivity can be prevented.

In addition, transparency of a nanowire network can be maintained even after junction, and mechanical flexibility can also be attained without an increase in sheet resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an electroconductive nanowire network, the method comprising:

forming a nanowire network using electroconductive nanowires, wherein the electroconductive nanowires are spin-coated to form the nanowire network; and welding junctions of the electroconductive nanowires by irradiating an electron beam on the nanowire network, wherein the electron beam is a large pulsed electron beam (LPEB) having a pulse rate of 0.1 to 0.2 Hz and being irradiated 1 to 3 times, an acceleration voltage of the LPEB being set to 5 kV or less, wherein heat is generated only at the junctions by irradiating the LPEB.

2. The method of claim 1, wherein a diameter of the electron beam is 50 to 80 mm.

3. The method of claim 1, wherein the electroconductive nanowires comprise silver (Ag) nanowires.

4. The method of claim 3, wherein the nanowire network is formed by spin-coating a suspension in which isopropyl alcohol (IPA) and the Ag nanowires are mixed.

5. The method of claim 4, wherein a length of the Ag nanowires is 20 to 30 μm, and a diameter thereof is 30 to 40 nm.

* * * * *